(12) United States Patent
Maerzinger et al.

(10) Patent No.: US 9,948,450 B2
(45) Date of Patent: *Apr. 17, 2018

(54) FREQUENCY GENERATOR

(71) Applicant: Intel Deutschland GmbH, Neubiberg (DE)

(72) Inventors: Guenter Maerzinger, Linz (AT); Bernd Adler, Neubiberg (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/176,706

(22) Filed: Jun. 8, 2016

(65) Prior Publication Data

US 2016/0285618 A1    Sep. 29, 2016

Related U.S. Application Data

(63) Continuation of application No. 14/516,188, filed on Oct. 16, 2014, now abandoned, which is a (Continued)

(30) Foreign Application Priority Data

Mar. 14, 2006    (DE) .................. 10 2006 011 682

(51) Int. Cl.
*H04B 1/40*    (2015.01)
*H04B 1/403*   (2015.01)
(Continued)

(52) U.S. Cl.
CPC .............. *H04L 7/0331* (2013.01); *H03L 7/23* (2013.01); *H04B 1/40* (2013.01); *H04L 7/0012* (2013.01); *H04L 7/033* (2013.01)

(58) Field of Classification Search
CPC . H04B 1/38; H04B 1/40; H04B 1/401; H04B 1/403; H04B 1/44; H04B 1/48; H03L 7/23; H03L 7/24
See application file for complete search history.

(56) References Cited

U.S. PATENT DOCUMENTS

| 4,868,524 A | 9/1989 | Costlow et al. |
| 5,276,913 A | 1/1994 | Lee et al. |

(Continued)

FOREIGN PATENT DOCUMENTS

| DE | 19913110 C1 | 11/2000 |
| DE | 19938515 A1 | 3/2001 |
| EP | 0585050 A2 | 3/1994 |

OTHER PUBLICATIONS

"U.S. Appl. No. 11/685,288, Advisory Action dated Sep. 3, 2010", 4 pgs.
(Continued)

*Primary Examiner* — Andrew Wendell
(74) *Attorney, Agent, or Firm* — Schwegman Lundberg & Woessner, P.A.

(57) ABSTRACT

A frequency generator for providing one or more clock signals with reduced phase jitter can include a phase-locked loop (PLL) configured to couple with a crystal and to provide a first clock signal, a multiplier circuit configured to receive the first clock signal and to provide a second clock signal, the second clock signal having a higher frequency than the first clock signal, wherein the multiplier circuit includes a second PLL, and wherein the second clock signal is an output frequency signal of the frequency generator.

22 Claims, 2 Drawing Sheets

Related U.S. Application Data continuation of application No. 11/685,288, filed on Mar. 13, 2007, now Pat. No. 8,880,005.

(51) Int. Cl.
*H04L 7/033* (2006.01)
*H03L 7/23* (2006.01)
*H04L 7/00* (2006.01)

(56) References Cited

U.S. PATENT DOCUMENTS

| | | | |
|---|---|---|---|
| 5,574,986 | A | 11/1996 | Mobach |
| 6,297,702 | B1 | 10/2001 | Locker et al. |
| 6,484,038 | B1 | 11/2002 | Gore et al. |
| 6,621,853 | B1 | 9/2003 | Ku |
| 6,735,426 | B1 | 5/2004 | Pau |
| 6,738,602 | B1 | 5/2004 | Heinen et al. |
| 7,120,427 | B1 | 10/2006 | Adams et al. |
| 7,457,271 | B2 | 11/2008 | Donovan |
| 7,587,131 | B1* | 9/2009 | Melanson ........ G11B 20/10037 381/97 |
| 8,880,005 | B2 | 11/2014 | Maerzinger et al. |
| 2001/0017557 | A1 | 8/2001 | Friedrich et al. |
| 2002/0118069 | A1 | 8/2002 | Fujiwara et al. |
| 2002/0147014 | A1 | 10/2002 | Atarius et al. |
| 2003/0078011 | A1 | 4/2003 | Cheng et al. |
| 2003/0190903 | A1 | 10/2003 | Melamed |
| 2004/0152484 | A1 | 8/2004 | Pratt |
| 2005/0227629 | A1 | 10/2005 | Ali et al. |
| 2005/0245200 | A1* | 11/2005 | Kluge .................. H03L 7/0812 455/76 |
| 2005/0250464 | A1 | 11/2005 | Spencer et al. |
| 2007/0018732 | A1 | 1/2007 | Mattisson |
| 2007/0275672 | A1 | 11/2007 | Maerzinger et al. |
| 2008/0065927 | A1* | 3/2008 | Wu .......................... G06F 1/12 713/501 |
| 2015/0103966 | A1 | 4/2015 | Maerzinger et al. |

OTHER PUBLICATIONS

"U.S. Appl. No. 11/685,288, Appeal Brief filed Jan. 16, 2011", 13 pgs.

"U.S. Appl. No. 11/685,288, Decision to Pre-Appeal Brief mailed Dec. 9, 2010", 2 pgs.

"U.S. Appl. No. 11/685,288, Examiner's Answer dated Apr. 29, 2011", 10 pgs.

"U.S. Appl. No. 11/685,288, Final Office Action dated May 25, 2010", 10 pgs.

"U.S. Appl. No. 11/685,288, Non Final Office Action dated Feb. 11, 2014", 5 pgs.

"U.S. Appl. No. 11/685,288, Non Final Office Action dated Nov. 9, 2009", 9 pgs.

"U.S. Appl. No. 11/685,288, Notice of Allowance dated Jul. 2, 2014", 9 pgs.

"U.S. Appl. No. 11/685,288, Notice of Non-Compliant Appeal Brief mailed Feb. 1, 2011", 3 pgs.

"U.S. Appl. No. 11/685,288, Pre-Appeal Brief for Review filed Nov. 25, 2010", 6 pgs.

"U.S. Appl. No. 11/685,288, Reply Brief filed Jun. 29, 2011", 5 pgs.

"U.S. Appl. No. 11/685,288, Response filed Feb. 9, 2010 to Non Final Office Action dated Nov. 9, 2009", 9 pgs.

"U.S. Appl. No. 11/685,288, Response filed Jun. 11, 2014 to Non Final Office Action dated May 25, 2014", 7 pgs.

"U.S. Appl. No. 11/685,288, Response filed Aug. 25, 2010 to Final Office Action dated May 25, 2010", 10 pgs.

"U.S. Appl. No. 11/685,288, Supplemental Appeal Brief filed Feb. 23, 2011", 3 pgs.

"U.S. Appl. No. 14/516,188, Final Office Action dated Dec. 17, 2015", 11 pgs.

"U.S. Appl. No. 14/516,188, Non Final Office Action dated Jul. 23, 2015", 11 pgs.

"U.S. Appl. No. 14/516,188, Preliminary Amendment filed Dec. 23, 2014", 5 pgs.

"U.S. Appl. No. 14/516,188, Response filed Nov. 23, 2015 to Non Final Office Action dated Jul. 23, 2015", 6 pgs.

"Axcelerator Family PLL and Clock Management", Aclel Application Note, (Jun. 2003), 1-7.

Hajimiri, et al., "Jitter and Phase Noise in Ring Oscillators", IEEE Journal of Solid-Slate Circuits, vol. 34. No. 6, (Jun. 1999), 790-804.

Reza, Navid, et al., "Minimum Achievable Phase Noise of RC Oscillators", IEEE Journal of Solid-State Circuits No. 3., (Mar. 2005), 630-636.

"Germany Application Serial No. 102006063039.4, Office Action dated Oct. 26, 2017", w/English Translation, 16 pgs.

* cited by examiner

FREQUENCY GENERATOR

RELATED APPLICATION INFORMATION

This application is a continuation of and claims the benefit of priority to, Maerzinger et al., U.S. patent application Ser. No. 14/516,188, entitled, "TRANSCEIVER", filed on Oct. 16, 2014, which is a continuation of U.S. patent application Ser. No. 11/685,288, filed on Mar. 13, 2007, now issued as U.S. Pat. No. 8,880,005, which claims priority to German Patent Application DE 10 2006 011 682.8-35, filed on Mar. 14, 2006, each of which is hereby incorporated by reference herein in their entirety.

FIELD OF THE INVENTION

The present subject matter relates to a frequency generator. In particular, the present subject matter relates to a frequency generator, for example, for use in a communication system.

BACKGROUND

A transceiver is used to transmit information in a communication system, e.g. a mobile radio system or a wire based communication system. The transceiver architecture for implementing broadband transmission standards, such as UMTS (Universal Mobile Telecommunications System), requires the generation of suitable clock signals for use in the respective standard. In a common communication system the clock signal is too high to be generated directly using a crystal oscillator. Therefore, oscillator circuitry is provided to generate the clock signal.

While transmission frequencies used in a communication system are becoming higher, the interference between the transmission signal and clock signals is getting more important. The interference may cause degradation in the quality of signal transmission. In consequence, increased demands are imposed on a spectral purity of the clock signals. In particular, the clock signal should have a minimum amount of phase noise (jitter).

As soon as clock signals at a higher frequency are required, a DLL (Delay-Locked Loop) circuit may be used to multiply the frequency of the crystal oscillator. A DLL circuit is a control loop in which an oscillator is stabilized by means of a reference frequency signal. The spectral purity of the clock generated in this manner is sufficient to supply a clock signal to digital blocks such as DSP (Digital Signal Processing) blocks and digital/analogue converters (DACs), for example. However, the quality of a clock signal generated in a DLL is insufficient in terms of the spectral purity required. It may not be used as a reference signal for a so-called phase-locked loop (PLL) to generate the transmission signal. For this and other reasons, there is a need for the present invention.

OVERVIEW

A frequency generator for providing one or more clock signals with reduced phase jitter can include a phase-locked loop (PLL) configured to couple with a crystal and to provide a first clock signal, a multiplier circuit configured to receive the first clock signal and to provide a second clock signal, the second clock signal having a higher frequency than the first clock signal, wherein the multiplier circuit includes a second PLL, and wherein the second clock signal is an output frequency signal of the frequency generator.

BRIEF DESCRIPTION OF THE DRAWINGS

The accompanying drawings are included to provide a further understanding of the invention and are incorporated in and constitute a part of this specification. The drawings illustrate the embodiments of the invention and together with the description serve to explain the principles of the invention. Other embodiments of the invention and many of the intended advantages of the invention will be readily appreciated as they become better understood by reference to the following description. Like references numerals designate corresponding similar parts.

DETAILED DESCRIPTION OF THE INVENTION

Figure 1:
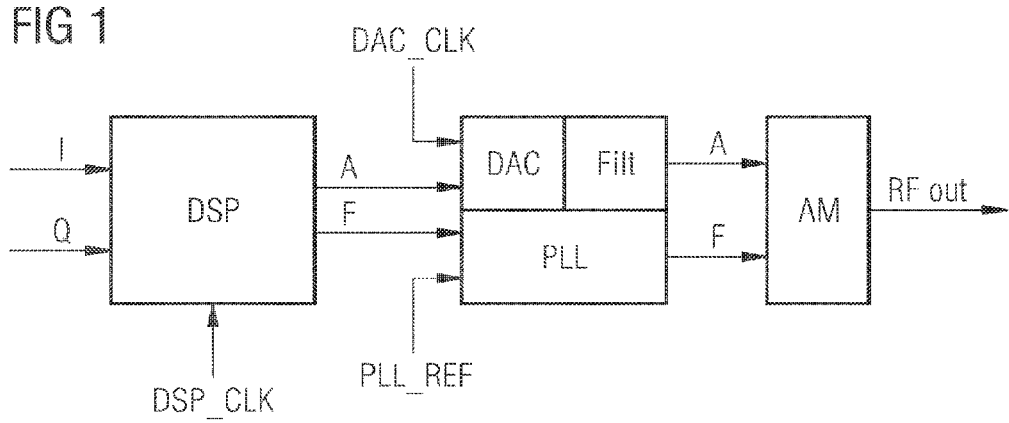
FIG. 1 illustrates a block diagram of a polar modulator of a mobile radio.

FIG. 1 illustrates the block diagram of a polar modulator of a mobile radio. The polar modulator comprises blocks, which impose increased demands on clock signals used in the system. A digital signal processor DSP, to which input signals I and Q are applied, requires a high operating frequency DSPCLK. In this case, a signal I indicates the real part of a complex baseband signal. A second signal Q represents the imaginary part of said baseband signal.

A digital/analogue converter DAC requires both a high operating frequency and a high spectral purity of the applied clock signals $DAC_{CLK}$. A phase-locked loop PLL, which is used as a phase modulator also requires a high operating frequency with a high spectral purity of the clock signals $PLL_{REF}$.

An output signal from the digital signal processor DSP makes use of a polar representation having an amplitude component A and a phase component F. The amplitude signal A is injected into a digital/analogue converter DAC and the phase signal F is injected into a phase-locked loop PLL.

For use as a polar modulator, the amplitude signal A is applied to the corresponding amplitude signal input A of an amplitude modulator AM via the digital/analogue converter DAC and a filter Filt, while the output signal from the phase-locked loop is injected into the phase signal input F of the amplitude modulator AM. The amplitude modulator generates a radio-frequency signal $RF_{out}$ and provides it to its output.

Figure 2:
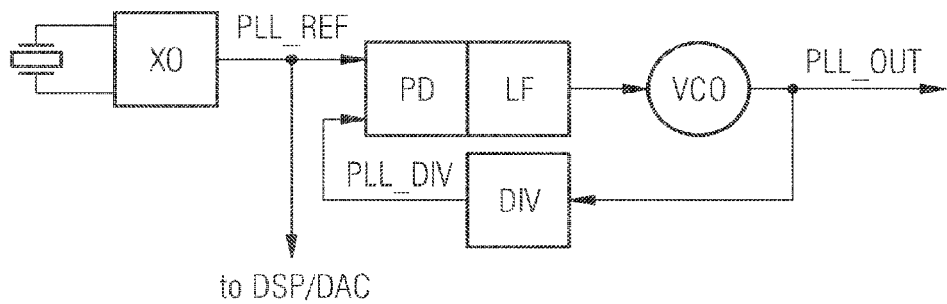
FIG. 2 illustrates a block diagram of a phase-locked loop with an external crystal oscillator for generating a reference.

FIG. 2 shows a phased-locked loop in which the reference frequency PLLREF is fed into a phase detector PD from an external crystal oscillator XO. An output signal of the phase detector PD is applied to a voltage-controlled oscillator (VCO) via a loop filter LF. The VCO generates an output signal $PLL_{out}$. The output signal $PLL_{out}$ is fed back into the phase detector PD via a divider element DIV. Furthermore the output signal $PLL_{put}$ is provided at an output of the phase-locked-loop for further data processing.

The reference signal $PLL_{REF}$ may be simultaneously fed into a digital signal processor DSP or a digital/analogue converter DAC as a clock signal.

Figure 3:
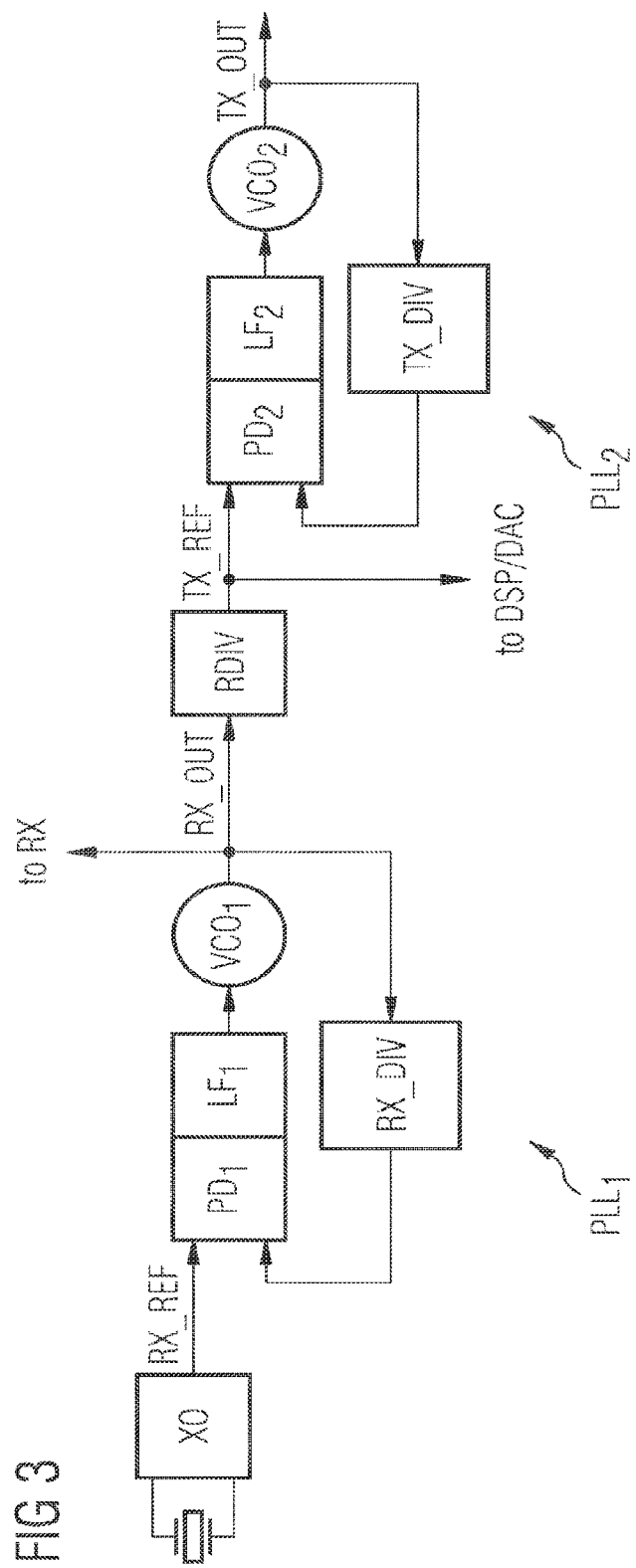
FIG. 3 illustrates an embodiment of a transceiver according to the present invention.

FIG. 3 shows the block diagram of a cascaded phased-locked loop circuit. An external crystal oscillator XO generates a reference frequency signal $RX_{REF}$ which is injected into a phase detector $PD_1$ of the first phase-locked loop $PLL_1$. The signal is injected into a voltage-controlled oscillator $VCO_1$ via a loop filter $LF_1$. The output signal $RX_{OUT}$ from said oscillator is then used, on the one band, as a clock signal for the reception path of the mobile radio circuit. In radio-frequency technology, the signal $RX_{OUT}$ is also referred to as a local oscillator signal. The signal $RX_{OUT}$ is fed back to the phase detector $PD_1$ again via a divider element $RX_{DIV}$.

The output signal $RX_{OUT}$ from the reception phase-locked loop $PLL_1$ is injected into a second phase-locked loop $PLL_2$. The injection may be effected directly or indirectly, e.g. via a frequency divider element RDIV as shown in FIG. 3. The frequency divider element RDIV provides a reference frequency signal $TX_{REF}$ derived from the output signal $RX_{OUT}$. The reference frequency signal $TX_{REF}$ received by the second phase-locked loop $PLL_2$ is injected into a second phase detector $PD_2$. The signal $TX_{REF}$ may be used as a clock signal for the digital signal processor DSP or for the digital/analogue converter DAC. Furthermore, the signal $TX_{REF}$ is injected via a loop filter $LF_2$, into a voltage-controlled oscillator $VCO_2$. The voltage-controlled oscillator $VCO_2$ generates an output signal $TX_{OUT}$ from this second phase-locked loop $PLL_2$. The output signal $TX_{OUT}$ fed back to the second phase detector $PD_2$ via a divider element $TX_{DIV}$. Furthermore, output signal $TX_{OUT}$ is provided at an output of the second phase-locked loop $PLL_2$ for further signal processing.

The respective control loops of the two phase-locked loops $PLL_1$ and $PLL_2$, which are connected in series in cascaded fashion, are each used to ensure that the respective frequencies generated are kept stable. This results in the clock signal jitter being minimized.

A concept of the embodiment shown in FIG. 3 is that the first frequency signal generator is used to generate a spectrally pure reference frequency signal for the second frequency signal generator. A greater demand is imposed on the spectral purity and bandwidth of the second frequency signal generator, which provides a clock signal for a transmission path of the transceiver circuit arrangement, than on the first frequency signal generator which provides a clock signal for a reception path of the transceiver circuit arrangement. These demands can be resolved by using a correspondingly high and stabilized reference frequency signal. This may be effected by virtue of the reception frequency signal being used as a reference frequency signal for the second frequency signal generator.

In other words, the transceiver comprises a cascaded frequency signal generator circuit, which provides a spectrally pure clock signal at frequencies higher than a frequency of an external crystal oscillator with a sufficiently high spectral purity.

The second frequency signal generator is a phase-locked loop. The second frequency signal generator thus generates the transmission frequency signal by comparing the latter or a multiple or divided value of the latter with the reference frequency signal. The phase-locked loop can generate a stable output signal, that is to say a stable transmission frequency signal, at different frequencies.

The first frequency signal generator may be a phase-locked loop. The first frequency signal generator can advantageously generate a stable output signal, that is to say a stable reception frequency signal, at different frequencies.

The transceiver includes a crystal oscillator, which is coupled to the first frequency signal generator in order to supply a frequency signal to the latter as a first reference frequency signal. The first frequency signal generator thus has a very stable first reference frequency signal as a reference for generating the reception frequency signal.

An output of the first frequency signal generator connects to an input of the second frequency signal generator via a frequency divider in order to inject the reception frequency signal into the second frequency signal generator as a reference frequency signal. The reference frequency signal for the second frequency signal generator may thus be supplied to the second frequency signal generator at different frequencies and in particular, at a frequency that differs from the frequency of the reception frequency signal.

The frequency divider is arranged, so that the reference frequency signal is divided down to a frequency depending on the use of the output signals, e.g. between 100 MHz and 300 MHz. The transceiver is thus operable in mobile radio systems, for example UMTS or in a wireline communication system.

The reception frequency signal is simultaneously a clock signal for a reception path of the transceiver circuit arrangement. The transmission frequency signal is a second clock signal in a transmission path of the transceiver circuit arrangement.

For use of the cascaded phased-locked loop circuit shown in FIG. 3 in a transceiver, or in more general terms in a Modulator/Demodulator circuitry, the output of the first phase-locked loop $PLL_1$ couples to a demodulator in a reception path of the transceiver. The second phase-locked loop $PLL_2$ couples to a modulator in a transmit path of the transceiver.

What is claimed is:

1. A frequency generator for providing one or more clock signals with reduced phase jitter, the frequency generator comprising:
   a phase-locked loop (PLL) configured to couple with a crystal oscillator and to provide a first clock signal;
   a multiplier circuit configured to receive the first clock signal and to provide a second clock signal, the second clock signal having a higher frequency than the first clock signal;
   wherein the multiplier circuit includes a second PLL; and
   wherein the second clock signal is an output frequency signal of the frequency generator.

2. The frequency generator of claim 1, wherein a feedback circuit of the second PLL includes a frequency divider.

3. The frequency generator of claim 1, wherein the PLL is configured to provide the first clock signal to a processing path of a transceiver.

4. The frequency generator of claim 1, wherein the multiplier circuit is configured to provide the second clock signal to a processing path of a transceiver.

5. The frequency generator of claim 1, wherein the PLL is configured to provide the first clock signal to a first processing path of a transceiver; and
   wherein the multiplier circuit is configured to provide the second clock signal to a second processing path of the transceiver.

6. The frequency generator of claim 1, wherein the PLL is configured to provide the first clock signal to a wireless receiver; and
   wherein the multiplier circuit is configured to provide the second clock signal to a wireless transmitter.

7. The frequency generator of claim 1, wherein an input of the multiplier circuit configured to receive the first clock signal is coupled to an output of the PLL.

8. The frequency generator of claim 1, wherein at least one of the first clock signal or the second clock signal is configured to drive a broadband processor.

9. The frequency generator of claim 1, wherein a frequency of the second clock signal is a multiple of a frequency of the first clock signal.

10. A transceiver comprising:
 a frequency generator configured to provide one or more clock signals with reduced phase jitter to one or more processing paths of the transceiver; the frequency generator comprising:
 a phase-locked loop (PLL) configured to couple with a crystal oscillator and to provide a first clock signal;
 a multiplier circuit configured to receive the first clock signal and to provide a second clock signal, the second clock signal having a higher frequency than the first clock signal;
 wherein the multiplier circuit includes a second PLL; and
 wherein the second clock signal is an output frequency signal of the frequency generator.

11. The transceiver of claim 10, wherein the one or more processing paths includes a reception processing path configured to receive the first clock signal.

12. The transceiver of claim 11, wherein the transceiver is a wireless transceiver.

13. The transceiver of claim 10, wherein the one or more processing paths includes a transmission processing path configured to receive the second clock signal.

14. The transceiver of claim 13, wherein the transceiver is a wireless transceiver.

15. The transceiver of claim 10, wherein an input of the multiplier circuit configured to receive the first clock signal is coupled to an output of the PLL.

16. The transceiver of claim 10, wherein the one or more processing paths includes a reception processing path configured to receive the first clock signal; and
 wherein the one or more processing paths includes a transmission processing path configured to receive the second clock signal.

17. The transceiver of claim 16, wherein the transceiver is a wireless transceiver.

18. The transceiver of claim 10, including a broadband processor configured to receive at least one of the first clock signal or the second clock signal.

19. A system for broadband communication, the system comprising:
 a processor configured to process a first baseband signal from a first processing path of the system and to provide a second baseband signal to a second processing path of the system; and
 a transceiver configured to transmit the first baseband signal and to receive the second baseband signal, the transceiver comprising:
 a frequency generator configured to provide one or more clock signals, with reduced phase jitter, to the first and second processing paths; the frequency generator comprising:
 a phase-locked loop (PLL) configured to couple with a crystal oscillator and to provide a first clock signal;
 a multiplier circuit configured to receive the first clock signal and to provide a second clock signal, the second clock signal having a higher frequency than the first clock signal; and
 wherein the multiplier circuit includes a second PLL.

20. The system of claim 19, including a wire medium for carrying the first and second broadband signals into and out of the system.

21. The system of claim 19, including an antenna for carrying the first and second broadband signals into and out of the system.

22. The system of claim 19, wherein the processor include a field programmable gate array.

* * * * *